(12) United States Patent
Min et al.

(10) Patent No.: US 11,821,082 B2
(45) Date of Patent: Nov. 21, 2023

(54) REDUCED DEFECT DEPOSITION PROCESSES

(71) Applicant: Applied Materials, Inc., Santa Clara, CA (US)

(72) Inventors: Xiaoquan Min, Cupertino, CA (US); Byung Ik Song, Yongin-si (KR); Hyung Je Woo, Morgan Hill, CA (US); Venkata Sharat Chandra Parimi, Sunnyvale, CA (US); Prashant Kumar Kulshreshtha, San Jose, CA (US); Kwangduk Lee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 11 days.

(21) Appl. No.: 17/081,488

(22) Filed: Oct. 27, 2020

(65) Prior Publication Data
US 2021/0130949 A1    May 6, 2021

Related U.S. Application Data

(60) Provisional application No. 62/929,321, filed on Nov. 1, 2019.

(51) Int. Cl.
*C23C 16/44* (2006.01)
*H01J 37/32* (2006.01)

(52) U.S. Cl.
CPC ...... *C23C 16/4404* (2013.01); *C23C 16/4405* (2013.01); *H01J 37/32477* (2013.01); *H01J 37/32862* (2013.01)

(58) Field of Classification Search
CPC .................. C23C 16/4404; C23C 16/4405
See application file for complete search history.

(56) References Cited

U.S. PATENT DOCUMENTS

| | | |
|---|---|---|
| 2005/0214455 A1 | 9/2005 | Li et al. |
| 2006/0264060 A1 | 11/2006 | Ramaswamy et al. |

(Continued)

FOREIGN PATENT DOCUMENTS

| | | | |
|---|---|---|---|
| EP | 0 892 083 | * | 1/1999 |
| JP | 2017-098543 A | | 6/2017 |

(Continued)

OTHER PUBLICATIONS

International Search Report and Written Opinion dated Feb. 2, 2021 in International Patent Application No. PCT/US2020/057500, 8 pages.

(Continued)

*Primary Examiner* — Elizabeth A Burkhart
(74) *Attorney, Agent, or Firm* — Kilpatrick Townsend & Stockton LLP

(57) ABSTRACT

Exemplary methods of semiconductor processing may include forming a silicon oxide material on exposed surfaces of a processing region of a semiconductor processing chamber. The methods may include forming a silicon nitride material overlying the silicon oxide material. The methods may include performing a deposition process on a semiconductor substrate disposed within the processing region of the semiconductor processing chamber. The methods may include performing a chamber cleaning process.

19 Claims, 3 Drawing Sheets

(56) References Cited

U.S. PATENT DOCUMENTS

2012/0040536 A1* 2/2012 Furuta ................. C23C 16/4404
  438/791
2018/0218902 A1* 8/2018 Venkatasubramanian ...................
  H01L 21/02274

FOREIGN PATENT DOCUMENTS

| KR | 2007-0030596 A | 3/2007 |
| KR | 2016-0062370 A | 6/2016 |
| KR | 2017-0059211 A | 5/2017 |
| TW | 2007-02485 A | 1/2007 |

OTHER PUBLICATIONS

Application No. PCT/US2020/057500 , International Preliminary Report on Patentability, dated May 12, 2022, 7 pages.

* cited by examiner

REDUCED DEFECT DEPOSITION PROCESSES

CROSS REFERENCES TO RELATED APPLICATIONS

This application claims the benefit of priority to U.S. Patent Application No. 62/929,321 filed Nov. 1, 2019, the contents of which are hereby incorporated by reference in their entirety for all purposes.

TECHNICAL FIELD

The present technology relates to methods and components for semiconductor processing. More specifically, the present technology relates to substrate support assemblies and methods of performing deposition processes.

BACKGROUND

Integrated circuits are made possible by processes which produce intricately patterned material layers on substrate surfaces. Producing patterned material on a substrate requires controlled methods for forming and removing material. Deposition processes may form material that attaches to many components of the system. This material may fall back on to wafers as defects subsequent the deposition processes, which may cause device failure depending on the extent.

Thus, there is a need for improved systems and methods that can be used to produce high quality devices and structures. These and other needs are addressed by the present technology.

SUMMARY

Exemplary methods of semiconductor processing may include forming a silicon oxide material on exposed surfaces of a processing region of a semiconductor processing chamber. The methods may include forming a silicon nitride material overlying the silicon oxide material. The methods may include performing a deposition process on a semiconductor substrate disposed within the processing region of the semiconductor processing chamber. The methods may include performing a chamber cleaning process.

In some embodiments, the deposition process may include a carbon-containing hardmask film. The silicon oxide material and the silicon nitride material may be formed on a substrate support within the processing region of the semiconductor processing chamber. The methods may include positioning the semiconductor substrate on the substrate support prior to performing the deposition process. The semiconductor substrate may be positioned on the silicon nitride material formed on the substrate support. The chamber cleaning process may include a plasma enhanced clean with a halogen-containing precursor. The semiconductor substrate may be disposed on a substrate support characterized by a substantially planar support surface. The substrate support may be a bipolar electrostatic chuck. The silicon oxide material may be formed to a first thickness, and the silicon nitride material may be formed to a second thickness greater than the first thickness.

Some embodiments of the present technology may encompass semiconductor processing methods. The methods may include performing a chamber cleaning process in a processing region of a semiconductor processing chamber. The methods may include forming a silicon oxide material on exposed surfaces of the processing region of the semiconductor processing chamber. The methods may include forming a silicon nitride material overlying the silicon oxide material. The methods may include providing a semiconductor substrate to a substrate support positioned in the processing region of the semiconductor processing chamber. The methods may include performing a deposition process on the semiconductor substrate.

In some embodiments the deposition process may be a tungsten carbide hardmask film. The silicon oxide material and the silicon nitride material may be formed on the substrate support prior to providing the semiconductor substrate to the substrate support. The silicon oxide material may be formed to a first thickness, and the silicon nitride material may be formed to a second thickness greater than the first thickness. The first thickness may be less than or about 20 nm, and the second thickness may be greater than or about 50 nm. The substrate support may be characterized by a first surface on which the semiconductor substrate may be positioned. the first surface may be substantially planar across a diameter of the first surface. The substrate support may be a bipolar electrostatic chuck.

Some embodiments of the present technology may encompass semiconductor processing methods. The methods may include forming a silicon oxide material to a first thickness on interior surfaces of a processing region of a semiconductor processing chamber. The methods may include forming a silicon nitride material overlying the silicon oxide material. The silicon nitride material may be formed to a second thickness greater than the first thickness. The methods may include providing a semiconductor substrate to a substrate support positioned in the processing region of the semiconductor processing chamber. The methods may include forming a tungsten-containing material on the semiconductor substrate.

In some embodiments the methods may include removing the semiconductor substrate from the semiconductor processing chamber. The methods may include performing a chamber cleaning process in the processing region of the semiconductor processing chamber. The first thickness may be less than or about 20 nm, and the second thickness may be greater than or about 50 nm. The substrate support may be characterized by a first surface on which the semiconductor substrate is positioned. The first surface may be substantially planar and free of edge rings and alignment tabs on the first surface of the substrate support. The substrate support may be a bipolar electrostatic chuck.

Such technology may provide numerous benefits over conventional systems and techniques. For example, embodiments of the present technology may provide chamber treatments that reduce fall-on particles during a number of deposition processes. Additionally, the present technology may reduce chamber corrosion during plasma processing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
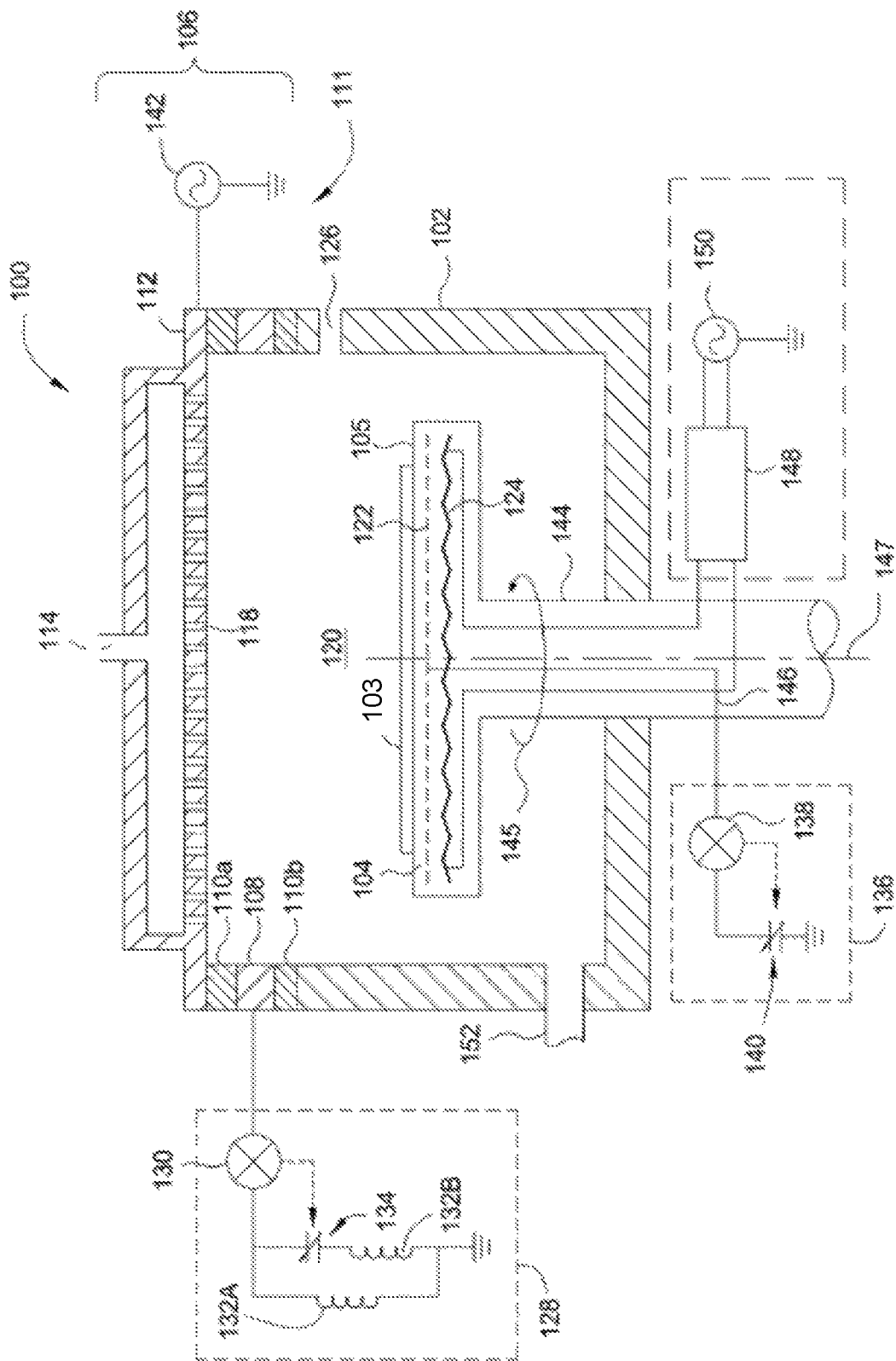
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. However, the formed materials may not be deposited solely on the substrate. For example, materials formed with an in situ plasma may deposit on many surfaces within the region, such as chamber walls, substrate supports, showerheads, or other components. Often, additional cleaning operations may also be performed within the chamber, which may also be plasma-based to remove deposited materials from the surfaces. However, the cleaning may occur subsequent substrate removal from the chamber, and fall-on particle deposition may often occur while the substrate remains within the processing region of the chamber.

For example, in one exemplary deposition process for a hard mask material, a carbon-based material may be deposited, which also may include a metal-containing material, such as tungsten, to produce a tungsten and carbon film. The tungsten and carbon film may deposit on a number of chamber components as well. Chamber components within the processing region may be aluminum in some chambers, and the adhesion of tungsten carbide may be limited. The deposited material may flake off from the chamber components, and fall onto the substrate. Additionally, a number of particles may be trapped within the plasma during the formation. Once the plasma is extinguished, the particles may fall to the substrate.

For some processes, such as that may include metal materials like tungsten, the metal precursor may be or include a metal halide, such as tungsten halide, for example. During the plasma deposition, the halogen component, such as fluorine, for example, may dissociate from the tungsten or metal and produce fluorine radicals. The fluorine may react with exposed aluminum surfaces of the chamber or chamber components and produce aluminum fluoride. The aluminum fluoride may desorb or sublimate from heated components, and reform on cooler components within the processing region. The reformed material may be lower quality, and deposition materials may have even lower levels of adhesion, and may be more likely to fall onto the substrate. Similarly, due to the material deposition about the chamber, cleaning processes may be performed subsequent the deposition. In one example, a plasma cleaning process may be performed, which also may use halogen precursors. These precursors may also form aluminum fluoride and the concomitant challenges described above. Consequently, some techniques may produce substrate films having thousands of in-film defects.

The present technology overcomes these challenges by performing a type of chamber seasoning in which a silicon nitride material may be deposited on surfaces of the chamber prior to film formation on a substrate. As silicon nitride may not as readily deposit on aluminum, for example, a buffer layer of silicon oxide may first be formed over the aluminum, and the silicon nitride may be formed overlying the oxide. The silicon nitride may trap fluorine radicals formed in the processes, and may limit interactions between produced fluorine radicals and any aluminum surfaces within the chamber. Additionally, tungsten carbide or other materials produced during deposition may better adhere to silicon nitride, reducing the amount of material falling to the substrate. Aspects of the processing chamber, including the substrate support, may also be adjusted in some embodiments of the present technology to further reduce fall on particles. For example, in some embodiments a substantially planar substrate support may be utilized, which may allow an expanded plasma volume to be produced. This may extend particles trapped within the plasma into regions outside of the boundaries of the substrate, which may further reduce fall on particles.

Although the remaining disclosure will routinely identify specific deposition processes utilizing the disclosed technology, it will be readily understood that the systems and methods are equally applicable to other deposition, etch, and cleaning chambers, as well as processes as may occur in the described chambers. Accordingly, the technology should not be considered to be so limited as for use with these specific deposition processes or chambers alone. The disclosure will discuss one possible chamber that may include substrate support assemblies according to embodiments of the present technology before additional variations and adjustments to this system according to embodiments of the present technology are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
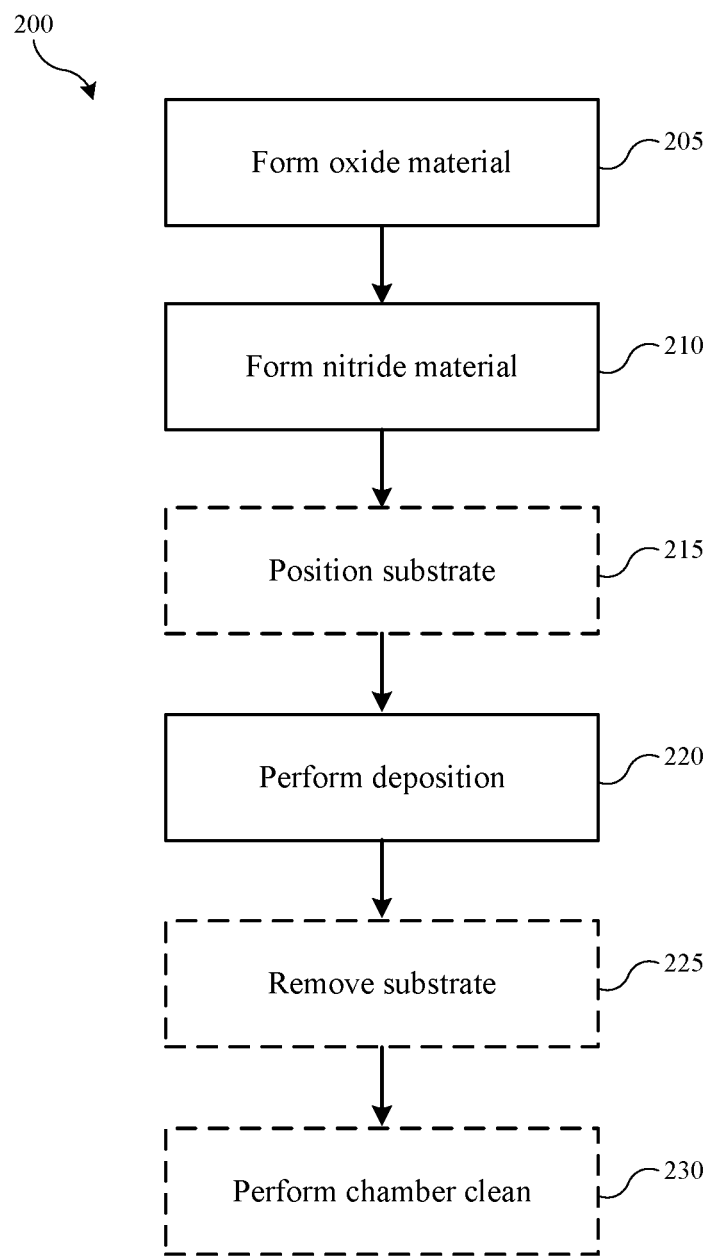
FIG. 2 shows operations in a semiconductor processing method according to some embodiments of the present technology.

FIG. 2 shows exemplary operations in a processing method 200 according to some embodiments of the present technology. The method may be performed in a variety of processing chambers, including processing system 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations performed with substrate support assemblies shown schematically in FIG. 3 below. It is to be understood that the figure illustrates only partial schematic views, and a substrate support assembly may contain any number of additional materials and features having a variety of characteristics and aspects as illustrated in the figures.

Method 200 may include a processing method that may form a protective film on surfaces within a substrate processing chamber prior to performing a deposition operation. The method may include optional operations prior to initiation of method 200, or the method may include additional operations. For example, method 200 may include operations performed in different orders than illustrated. For example, the method may be performed subsequent a previous chamber clean in some embodiments. As described previously, cleaning operations may utilize plasma enhanced halogen or other etchant precursors. Halogen materials may interact with aluminum chamber components as discussed above, which may cause aluminum fluoride to form and/or redeposit about the processing region of the chamber. In some embodiments, method 200 may include a plasma treatment, which may include a plasma enhanced precursor, which may be sent from a remote plasma unit or developed in situ in the processing region. The precursor may include a hydrogen-containing precursor, an oxygen-containing precursor, or any other precursor, which may be used or facilitate conversion of aluminum fluoride back into aluminum or aluminum oxide, for example. Additionally, the precursor may remove aluminum fluoride materials from the chamber.

A seasoning or treatment film may then be developed within the chamber with method 200. For example, an oxide material, such as silicon oxide, may be formed over surfaces of the processing chamber at operation 205, such as regions within the processing region, such as processing volume 120 described previously. The region may be an internal plasma region, which may be at least partially defined by a number of chamber components. For example, chamber sidewalls, a showerhead or faceplate, and a pedestal may all be included in or at least partially define aspects of the processing region. A plasma may be formed within the processing region and precursors for depositing silicon oxide may be introduced. The film of silicon oxide may be formed to a first thickness over the chamber surfaces, which may ensure a complete coating of surfaces.

After formation of the silicon oxide surface, method 200 may include forming a nitride material, such as silicon nitride, over the silicon oxide at operation 210. The silicon nitride may be formed to a second thickness over the silicon oxide. As explained previously, components within the processing chamber may be or include aluminum. Silicon nitride may not readily deposit or adhere on aluminum surfaces. Silicon nitride may, however, provide a film that may resist etching under processing conditions for which some film depositions may occur. For example, in one exemplary process as previously described in which a tungsten and carbon film is produced, the tungsten-containing precursor may include a halogenated tungsten precursor. The in situ plasma may dissociate the precursor forming halogen effluents, which may react with unprotected aluminum. Silicon nitride may trap fluorine, and may provide a better adhesion surface for tungsten and carbon films, which may reduce fall-on particles on the substrate. Silicon oxide may better adhere to aluminum, but may not provide afford sufficient adhesion for tungsten and carbon films, which may introduce additional fall-on particles to the substrate. Similarly, a subsequent plasma clean may further expose surfaces to fluorine, and silicon oxide may not readily withstand the plasma treatment. Consequently, a first surface layer of oxide and a second surface layer of nitride may readily adhere to the chamber surfaces, and may sufficiently withstand the plasma effluents during processing to reduce or limit fall on particles on the substrate.

Because the first layer and the second layer provide different benefits, the first layer of silicon oxide may be a different thickness than the second layer of silicon nitride. For example, in some embodiments a role of the silicon oxide may be to provide a full coating across the chamber surfaces. Accordingly, the first thickness may be limited to sufficiently coat the chamber surfaces. The first layer of oxide may therefore be characterized by a first thickness of less than or about 50 nm, and may be characterized by a first thickness of less than or about 40 nm, less than or about 30 nm, less than or about 20 nm, less than or about 10 nm, less than or about 9 nm, less than or about 8 nm, less than or about 7 nm, less than or about 6 nm, less than or about 5 nm, less than or about 4 nm, or less. The first layer may be characterized by a thickness greater than or about 1 nm or more, which may ensure a complete coverage of the interior surfaces. Were gaps to form in the coverage, the silicon nitride may not readily adhere, and aluminum exposure may occur.

In some embodiments, a role of the silicon nitride may be to provide a resistant coating during the plasma processing. Accordingly, the second thickness may be greater than the first thickness in some embodiments, which may afford improved resistance, gettering, and protection with plasma effluents. For example, the second layer of nitride may therefore be characterized by a second thickness of greater than or about 50 nm, and may be characterized by a thickness of greater than or about 60 nm, greater than or about 70 nm, greater than or about 80 nm, greater than or about 90 nm, greater than or about 100 nm, greater than or about 120 nm, greater than or about 140 nm, greater than or about 160 nm, greater than or about 180 nm, greater than or about 200 nm, or more.

Subsequent formation of the coating or seasoning, a substrate may be placed within the processing region at optional operation 215. For example, a substrate support may be coated with the oxide and the nitride during the method, and the substrate may be positioned overlying the first layer and second layer of material on the substrate support. For example, the substrate may be positioned on the silicon nitride material formed over the substrate support. A deposition process, a removal process, or some other semiconductor process may be performed at operation 220 on the substrate within the processing region of the chamber. In one exemplary deposition process encompassed by the present technology, a carbon-containing hardmask, such as a tungsten and carbon film, may be deposited on the substrate. After processing, the substrate may be removed from the processing region at optional operation 225. Residual carbon material or tungsten and carbon material from the process may have collected on surfaces of the silicon nitride. In other processes alternative precursors may be disposed on the surfaces protected by silicon nitride. Accordingly, in some embodiments a chamber clean may be performed at optional operation 230. The chamber clean may utilize a halogen-containing precursor, which may be plasma enhanced within the processing region to facilitate removal of residual materials. The cleaning process may remove some or all aspects of the residual tungsten and carbon material, and may remove some or all of each layer of the seasoning material in some embodiments.

The process may then be repeated for a subsequent substrate. In some embodiments the full method may not be repeated. For example, in some processing operations the silicon nitride material may not be fully removed across the processing region, and thus the silicon oxide material may remain intact. Consequently, in some embodiments the method may include forming or reforming or repairing the silicon nitride film. The method may be initiated with any of the noted operations in some embodiments. For example, in some embodiments the method may begin with an optional chamber clean occurring subsequent processing of a substrate. In some circumstances, the method may include performing a chamber clean and then forming a seasoning layer, or treating/repairing the seasoning layer. By producing a seasoning layer as noted, testing has shown that fall-on particles may be removed from over 15,000, to less than or about 1,000 during some processes, such as hardmask formation with a tungsten-containing carbon film. Additionally, fall-on particles may be reduced to less than or about 800, less than or about 500, less than or about 400, less than or about 300, less than or about 250, or less.

Figure 3:
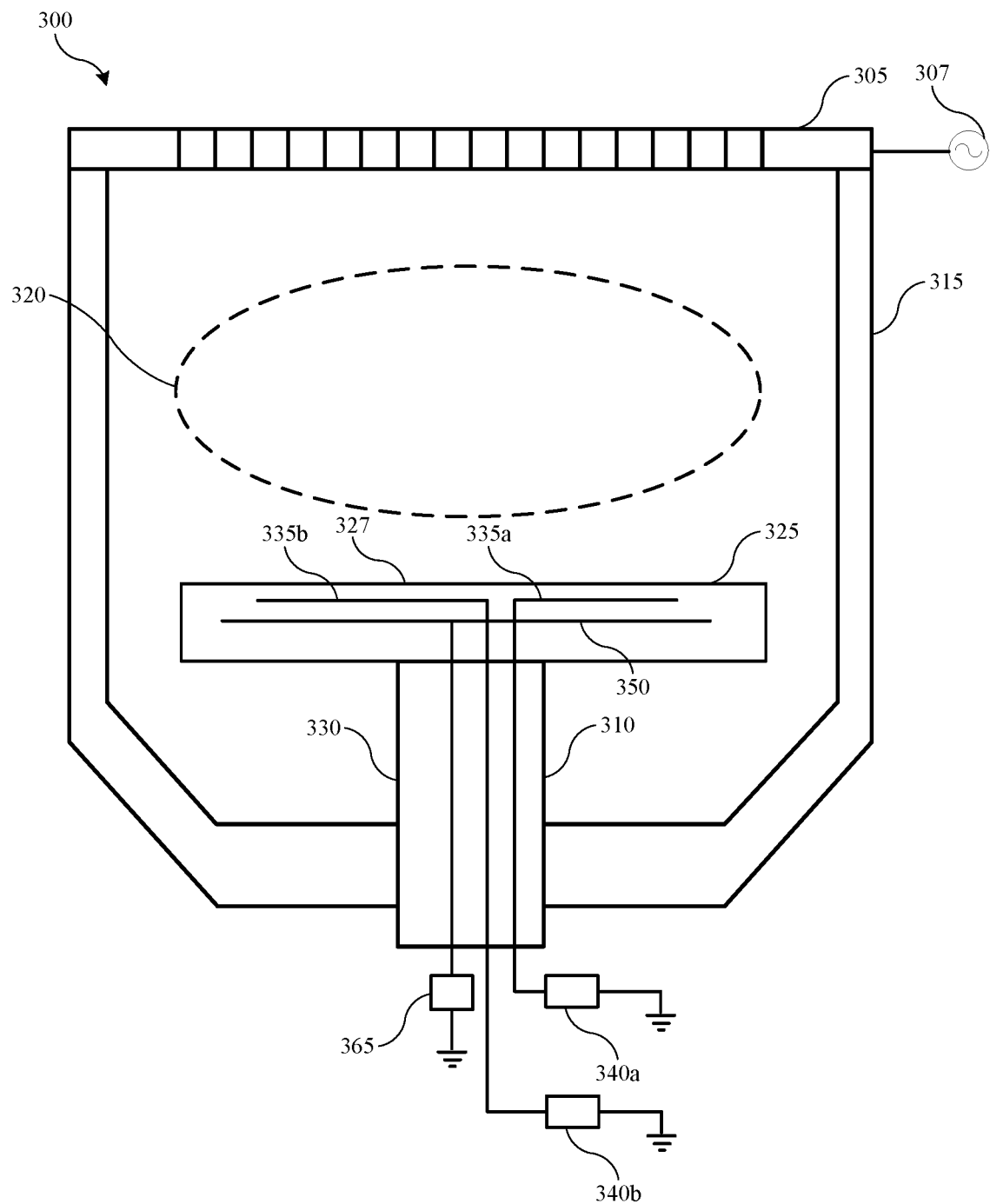
FIG. 3 shows a schematic partial cross-sectional view of an exemplary substrate processing chamber according to some embodiments of the present technology.

Although the seasoning may dramatically reduce fall-on particles in some embodiments of the present technology, further reductions may be sought. For example, particles that may be trapped in the plasma envelope may still fall to the substrate once deposition ends and the plasma is extinguished. Accordingly, some embodiments of the present technology may modify aspects of the processing chamber to further reduce fall-on particles. FIG. 3 shows a schematic partial cross-sectional view of an exemplary semiconductor processing chamber 300 according to some embodiments of the present technology. FIG. 3 may include one or more components discussed above with regard to FIG. 1, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include one or more electrodes 335, which may be DC electrodes, embedded within the chuck body proximate the substrate support surface. Electrodes 335 may be discussed further below.

In operation, a substrate may be in at least partial contact with the substrate support surface of the electrostatic chuck body, which may produce a contact gap, which may essentially produce a capacitive effect between a surface of the pedestal and the substrate. Voltage may be applied to the contact gap, which may generate an electrostatic force for chucking. The power supply 340 may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as will be explained further below. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. The chucking mesh electrode 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges.

A number of substrate supports may be encompassed by the present technology. In some embodiments, the substrate support may be modified to further reduce fall-on particles. As explained above, particles may be trapped in the formed plasma, and once the plasma is extinguished, the materials may fall to the substrate. Some substrate supports include materials that impact the plasma volume that is formed, and may constrain the plasma. For example, many substrate supports may form a recessed pocket on the substrate support surface, or may incorporate an edge ring onto the substrate support. These components may both maintain positioning of the substrate, and control the plasma volume to reduce deposition outside of radial dimensions of the substrate. However, when the plasma is allowed to extend further, and may extend closer to sidewalls 315, particles may be pulled outward from an area overlying the substrate, and may be brought to a region radially outward from the substrate, or drawn to and/or trapped within a nitride seasoning film as previously described.

Consequently, in some embodiments the substrate support may be characterized by a substantially planar support surface, such as surface 327, which may extend fully across a diameter of the substrate support, and which may allow expansion of the plasma volume developed in the processing region. Consequently, by planar may be meant that no recessed pocket, or a limited recessed pocket, may be formed, and that no edge ring may be included on the substrate support. Additionally, in some embodiments, alignment tabs, which may facilitate positioning and containment of a substrate, may not be included on the substrate support.

However, by removing aspects of the substrate support that may contain the substrate, alignment challenges may be presented. For example, without alignment tabs, an edge ring, or a recessed pocket, when vacuum is drawn within the processing chamber, the substrate may move on the planar substrate support. Mono-polar chucking may not maintain the substrate in these circumstances. Accordingly, in some embodiments, substrate support 310 may include a bipolar chuck to ensure clamping of the substrate to limit or prevent movement along the planar support surface 327.

Any number of bipolar chuck electrode configurations may be included in the pedestal to ensure the substrate remains chucked during processing. In one encompassed example as illustrated, electrode 335a may be electrically coupled with a power source 340a. Additionally, electrode 335b may be electrically coupled with a power source 340b. Power source 340a and power source 340b may be configured to deliver a voltage to the electrodes, and one source may deliver a positive voltage, while one source may deliver a negative voltage. This may clamp the substrate in place to overcome the challenges of mono-polar chucking on a planar substrate as noted above. A gap between the two electrodes 335 may be limited to ensure a uniform plasma density above the substrate.

As noted above, when a seasoning material may be formed over surfaces of the processing region, the substrate support may also be coated in the material. Because the substrate support may be operated as an electrostatic chuck, the deposited material may affect or otherwise impact chucking aspects. In some embodiments, to ensure proper chucking, the seasoning material be include and may be limited to dielectric materials, to limit the potential for shorting or other effects. In some embodiments, the dielectric materials of the seasoning layer or layers may also be limited to materials that may reduce or limit leakage current through the substrate support. For example, some dielectric materials that may operate effectively as seasoning layers may include additional components, such as carbon, boron, or other elements. However, these materials may add an amount of conductivity to the films formed. Although this may be acceptable on other chamber components, on the substrate support this may cause leakage current from the electrodes. Consequently, in some embodiments, the seasoning material may be limited to dielectric materials that may have reduced or limited conductivity to maintain adequate chucking. Accordingly, conductive materials or elements may be limited or excluded from the seasoning materials in some embodiments.

Power sources 340 may be configured to provide energy or voltage to the electrically conductive chuck electrodes 335. This may be operated to form a plasma of a precursor within the processing region 320 of the semiconductor processing chamber 300, although other plasma operations may similarly be sustained. For example, electrodes 335 may each be a chucking mesh that operate as electrical ground for a capacitive plasma system including an RF source 307 electrically coupled with showerhead 305. For example, electrodes 335 may operate as a ground path for RF power from the RF source 307, while also operating as an electric bias to the substrate to provide electrostatic clamping of the substrate to the substrate support surface. Power source 340 may include a filter, a power supply, and a number of other electrical components configured to provide a chucking voltage.

By including substrate supports characterized by a substantially planar surface, fall-on particles may be at least partially spread outward of the area overlying the substrate. Consequently, fall on particles on tested substrates were further reduced to less than 200, and may be reduced to less than or about 100, less than or about 50, less than or about 45, less than or about 40, less than or about 35, less than or about 30, less than or about 25, less than or about 20, less than or about 15, less than or about 10, or less in embodiments of the present technology. Hence, by forming seasoning layers within the processing chamber and/or utilizing a substantially planar substrate support, fall-on particles may be reduced by several orders of magnitude for processes encompassed by some embodiments of the present technology.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   forming a silicon oxide material on exposed surfaces of a processing region of a semiconductor processing chamber;
   forming a silicon nitride material overlying the silicon oxide material;
   performing a deposition process on a semiconductor substrate disposed within the processing region of the semiconductor processing chamber, wherein the deposition process comprises depositing a carbon-containing hardmask film, wherein the semiconductor substrate is disposed on a substrate support comprising a planar support surface, and wherein fall on particles on the semiconductor substrate are less than 200; and
   performing a chamber cleaning process.

2. The semiconductor processing method of claim 1, wherein the silicon oxide material and the silicon nitride material are formed on the substrate support within the processing region of the semiconductor processing chamber.

3. The semiconductor processing method of claim 2, further comprising:
   positioning the semiconductor substrate on the substrate support prior to performing the deposition process, wherein the semiconductor substrate is positioned on the silicon nitride material formed on the substrate support.

4. The semiconductor processing method of claim 1, wherein the chamber cleaning process comprises a plasma enhanced clean with a halogen-containing precursor.

5. The semiconductor processing method of claim 1, wherein the substrate support comprises a bipolar electrostatic chuck.

6. The semiconductor processing method of claim 1, wherein the silicon oxide material is formed to a first thickness, and wherein the silicon nitride material is formed to a second thickness greater than the first thickness.

7. The semiconductor processing method of claim 1, wherein the planar support surface is substantially planar across a diameter of the planar support surface.

8. The semiconductor processing method of claim 1, wherein the planar support surface is substantially planar and free of edge rings and alignment tabs on the planar support surface of the substrate support.

9. A semiconductor processing method comprising:
   performing a chamber cleaning process in a processing region of a semiconductor processing chamber;
   forming a silicon oxide material on exposed surfaces of the processing region of the semiconductor processing chamber;
   forming a silicon nitride material overlying the silicon oxide material;
   providing a semiconductor substrate to a substrate support positioned in the processing region of the semiconductor processing chamber, wherein the substrate support is characterized by a first surface on which the semiconductor substrate is positioned, and wherein the first surface is substantially planar across a diameter of the first surface; and performing a deposition process on the semiconductor substrate, wherein the deposition process comprises depositing a tungsten carbide hardmask film, and wherein fall on particles on the semiconductor substrate are less than 200.

10. The semiconductor processing method of claim 9, wherein the silicon oxide material and the silicon nitride material are formed on the substrate support prior to providing the semiconductor substrate to the substrate support.

11. The semiconductor processing method of claim 9, wherein the silicon oxide material is formed to a first thickness, and wherein the silicon nitride material is formed to a second thickness greater than the first thickness.

12. The semiconductor processing method of claim 11, wherein the first thickness is less than or about 20 nm, and wherein the second thickness is greater than or about 50 nm.

13. The semiconductor processing method of claim 9, wherein the substrate support comprises a bipolar electrostatic chuck.

14. A semiconductor processing method comprising:
forming a silicon oxide material to a first thickness on interior surfaces of a processing region of a semiconductor processing chamber;
forming a silicon nitride material overlying the silicon oxide material, wherein the silicon nitride material is formed to a second thickness greater than the first thickness;
providing a semiconductor substrate to a substrate support positioned in the processing region of the semiconductor processing chamber, wherein the substrate support is characterized by a first surface on which the semiconductor substrate is positioned, and wherein the first surface is substantially planar and free of edge rings and alignment tabs on the first surface of the substrate support; and
forming a tungsten-containing material on the semiconductor substrate, wherein the tungsten-containing material is formed on an outer radial portion of the semiconductor substrate.

15. The semiconductor processing method of claim 14, further comprising:
removing the semiconductor substrate from the semiconductor processing chamber; and
performing a chamber cleaning process in the processing region of the semiconductor processing chamber.

16. The semiconductor processing method of claim 14, wherein the first thickness is less than or about 20 nm, and wherein the second thickness is greater than or about 50 nm.

17. The semiconductor processing method of claim 14, wherein the substrate support comprises a bipolar electrostatic chuck.

18. The semiconductor processing method of claim 14, wherein the first surface is substantially planar across a diameter of the first surface.

19. The semiconductor processing method of claim 14, wherein fall on particles on the semiconductor substrate are less than 200.

* * * * *